US009136402B2

(12) United States Patent
Bedell et al.

(10) Patent No.: US 9,136,402 B2
(45) Date of Patent: Sep. 15, 2015

(54) HIGH EFFICIENCY FLEXIBLE SOLAR CELLS FOR CONSUMER ELECTRONICS

(71) Applicant: International Business Machines Corporation, Armonk, NY (US)

(72) Inventors: Stephen W. Bedell, Yorktown Heights, NY (US); Bahman Hekmatshoartabari, Yorktown Heights, NY (US); Devendra K. Sadana, Yorktown Heights, NY (US); Ghavam G. Shahidi, Yorktown Heights, NY (US); Davood Shahrjerdi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/657,086

(22) Filed: Oct. 22, 2012

(65) Prior Publication Data

US 2013/0220408 A1  Aug. 29, 2013

Related U.S. Application Data

(60) Provisional application No. 61/604,248, filed on Feb. 28, 2012.

(51) Int. Cl.
*H01L 31/02* (2006.01)
*H01L 31/0304* (2006.01)
(Continued)

(52) U.S. Cl.
CPC ............ *H01L 31/02* (2013.01); *H01L 31/0304* (2013.01); *H01L 31/03926* (2013.01);
(Continued)

(58) Field of Classification Search
CPC ............ H01L 31/02; H01L 31/02021; H01L 31/0304; H01L 31/0465; H01L 31/06875; H01L 31/0693; H01L 31/1892; H01L 31/03926; Y02E 10/544
USPC .................................................. 136/255, 252
See application file for complete search history.

(56) References Cited

U.S. PATENT DOCUMENTS 4,231,050 A * 10/1980 Casey et al. .................... 257/184
6,150,603 A * 11/2000 Karam et al. .................. 136/252
(Continued)

FOREIGN PATENT DOCUMENTS

EP           0905835 A1 *  3/1999
WO  WO 2010145648 A1 * 12/2010  ............. H01L 31/18

OTHER PUBLICATIONS

Bedell, et al., "Kerf-Less Removal of Si, Ge, and III-V Layers by Controlled Spalling to Enable Low-Cost PV Technologies", IEEE Journal of Photovoltaics, vol. 2, No. 2, Apr. 2012, (pp. 141-147).
(Continued)

*Primary Examiner* — Jeffrey T Barton
*Assistant Examiner* — Tae-Sik Kang
(74) *Attorney, Agent, or Firm* — Harrington & Smith; Louis J. Percello (57) ABSTRACT

A flexible solar cell comprises an epitaxially grown III-V layer having a first layer grown on a base substrate, at least one intermediate layer grown on the first layer, and a cap layer grown on the at least one intermediate layer, the III-V layer being separated from the base substrate by controllably spalling the first layer from the base substrate; and a flexible substrate coupled to the epitaxially grown III-V layer. The flexible solar cell may be used to provide power to an electronic device.

18 Claims, 5 Drawing Sheets

(51) Int. Cl.
 H01L 31/0465 (2014.01)
 H01L 31/0693 (2012.01)
 H01L 31/0392 (2006.01)
 H01L 31/0687 (2012.01)
 H01L 31/18 (2006.01)

(52) U.S. Cl.
 CPC ........ *H01L31/0465* (2014.12); *H01L 31/0693* (2013.01); *H01L 31/06875* (2013.01); *H01L 31/1892* (2013.01); *Y02E 10/544* (2013.01)

(56) References Cited

U.S. PATENT DOCUMENTS

| | | | |
|---|---|---|---|
| 2004/0200523 A1* | 10/2004 | King et al. | 136/262 |
| 2007/0048970 A1* | 3/2007 | Suzuki et al. | 438/455 |
| 2009/0325340 A1* | 12/2009 | Aslami | 438/80 |
| 2010/0009147 A1* | 1/2010 | Fukuda | 428/218 |
| 2010/0186822 A1* | 7/2010 | Pan et al. | 136/261 |
| 2010/0240165 A1* | 9/2010 | Jang et al. | 438/58 |
| 2010/0311250 A1 | 12/2010 | Bedell et al. | |
| 2011/0041898 A1* | 2/2011 | Cornfeld | 136/255 |
| 2012/0043814 A1 | 2/2012 | Deligianni et al. | |
| 2012/0091566 A1* | 4/2012 | Engelhart et al. | 257/629 |

OTHER PUBLICATIONS

Shahrjerdi, et al., "High Efficiency Thin-Film InGaP/InGaAs/Ge Tandem Solar Cells Enabled by Controlled Spalling Technology", Applied Physics Letters, (2012), (4 pages).

* cited by examiner

HIGH EFFICIENCY FLEXIBLE SOLAR CELLS FOR CONSUMER ELECTRONICS

CROSS REFERENCE TO RELATED APPLICATIONS

This application claims the benefits of U.S. Provisional Patent Application Ser. No. 61/604,248, filed Feb. 28, 2012, the contents of which are incorporated herein by reference in their entirety.

BACKGROUND

The exemplary embodiments of this invention relate generally to solar cell technology and, more particularly, to the monolithic integration of solar cells into flexible substrates.

Solar cell technology involves the generation of electrical power by converting solar radiation in the form of photon energy into direct current (DC) electricity. The conversion of solar radiation into electricity employs solar cells (also known as photovoltaic cells) that contain semiconductor materials. The solar cells are arranged and packaged to form a solar panel, which can be used alone or in conjunction with other solar panels to define a system that generates the electricity.

One general concern in the operation of any solar cell system is the maximizing of conversion efficiency of the photon energy into electrical energy under the constraint of minimum cost. The driving forces for innovation in an effort to reduce costs in solar cell technology include increasing the efficiency of the solar cells, decreasing material costs, and/or decreasing processing costs. Additionally, efforts have been made to incorporate basic solar panel systems into other materials to provide for a wider range of applications of solar cell technology.

One example of an effort to provide for a wider range of applications of solar cell technology involves the integration of solar panels with flexible materials to provide flexible structures. The resulting flexible structures can be incorporated into protective covers, holders, clothing, and the like. Current flexible solar cells, however, typically have rather low efficiency (less than about 12%) and generally cannot produce the required voltage needed for directly powering most consumer electronic devices but are instead used to charge batteries.

BRIEF SUMMARY

In one exemplary embodiment, a structure comprises an epitaxially grown layer of semiconductor material controllably spalled from a base substrate and a flexible substrate coupled to the epitaxially grown layer of semiconductor material.

In another exemplary embodiment, a structure comprises an epitaxially grown III-V layer comprising a first sub cell grown on a base substrate, at least one intermediate sub cell grown on the first layer, and a final sub cell grown on the at least one intermediate layer, the III-V layers being separated from the base substrate by controllably spalling the first layer from the base substrate. A flexible substrate is coupled to the epitaxially grown III-V layers.

In another exemplary embodiment, a method comprises providing a base substrate having a surface; disposing layers of III-V semiconductor material on the surface of the base substrate using a chemical vapor deposition technique or a molecular beam epitaxy technique; disposing a stressor layer on the layer of III-V semiconductor material; operatively associating a flexible handle substrate with the stressor layer; and using controlled spalling to separate the layer of III-V semiconductor material from the base substrate to expose a surface of the layer of III-V semiconductor material.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

As used herein, the term "III-V" refers to inorganic crystalline compound semiconductors having at least one Group III element and at least one Group V element. Exemplary III-V compounds for use in the structures and methods described herein include, but are not limited to, gallium phosphide (GaP), gallium arsenide (GaAs), gallium nitride (GaN), gallium arsenide phosphide (GaAsP), gallium indium arsenide antimony phosphide (GaInAsSbP), aluminum gallium arsenide (AlGaAs), aluminum gallium indium arsenide (AlGaInAs), indium arsenide (InAs), indium gallium phosphide (InGaP), indium gallium arsenide (InGaAs), indium arsenide antimony phosphide (InAsSbP), indium gallium aluminum phosphide (InGaAlP) and combinations of the foregoing.

High efficiency flexible III-V based solar cells are formed by epitaxially growing III-V semiconductor materials as layers on base substrates, integrating the semiconductor material layers with a flexible material, and using controlled spalling to remove the III-V semiconductor material layers and the flexible material from the base substrates. Once the III-V semiconductor material layers (hereinafter "III-V layers") are grown on the base substrates, the III-V layers may define upright or inverted single junction structures, multi-junction structures, or the like.

The use of controlled spalling allows for the kerf-free removal of the III-V layers from the base substrates at room temperature. The removed III-V layers are monolithically integrated with the flexible material to define the flexible solar cells. These flexible solar cells are arranged to provide power to a consumer electronic device. The integration and arrangement (e.g., the stacking and layout) of the solar cells can be tailored to meet the requirements desired for a specified product.

Figure 1:
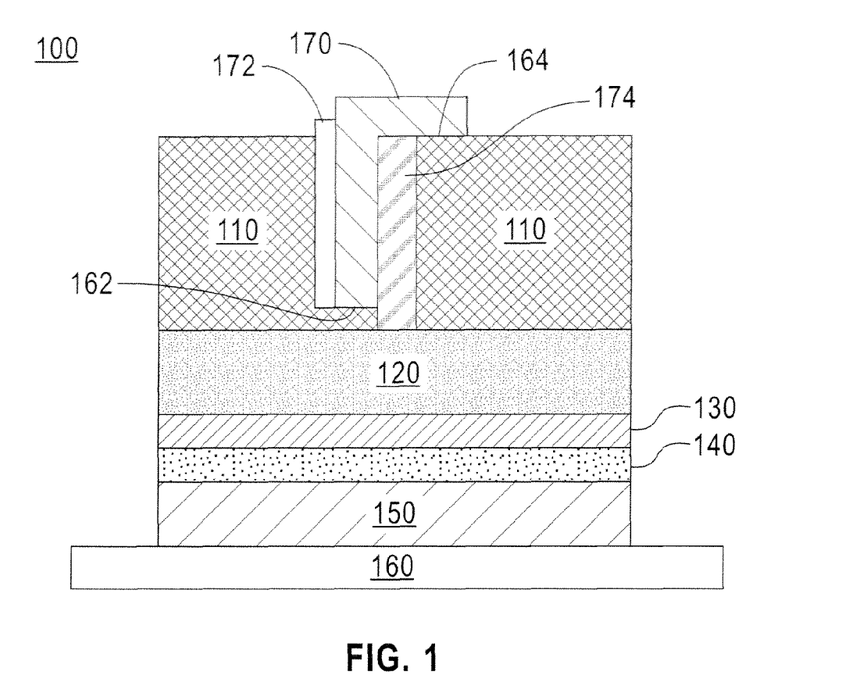
FIG. 1 is a side cross-sectional view of one embodiment of a monolithically integrated flexible solar cell, wherein the adjacent cells are connected in series.

As shown in FIG. 1, one exemplary embodiment of a structure comprising solar cells monolithically integrated with a flexible substrate is designated generally by the reference number 100 and is hereinafter referred to as "structure 100." Structure 100 comprises an epitaxially grown III-V layer 110, a semi-insulating layer 120 on the III-V layer 110, a dielectric layer 130 on the semi-insulating layer 120, a reflector layer 140 on the dielectric layer 130, a stressor layer 150 on the reflector layer 140, and a flexible handle substrate 160 on the stressor layer 150. An electrical contact 170 is disposed in the III-V layer 110 for connection of a first of the solar cells of the structure 100 to an adjacent solar cell in series fashion. Although the semi-insulating layer 120, the dielectric layer 130, and the reflector layer 140 are shown and described throughout the description herein, it should be understood that the semi-insulating layer 120, the dielectric layer 130, and the reflector layer 140 are optional in any of the described embodiments. The semi-insulating layer 120 or the dielectric layer 130 or the combination thereof provides electrical isolation between the solar cells and an optional metal reflector 140 or the metal stressor 150 in the absence of a metal reflector 140.

The epitaxially grown III-V layer 110 comprises a plurality of layers (shown at least in FIGS. 2 and 3) such that each plurality of layers forms a solar cell having an anode side 162 and a cathode side 164. Tunnel junctions are formed between each sub cell of the plurality of layers to connect the sub cells across the solar cell structure. A first insulator 172 and a second insulator 174 are disposed so as to inhibit shorting between the layers of each solar cell across the electrical contact 170. In connecting the solar cells of the III-V layer 110 to other solar cells, the first insulator 172 and the second insulator 174 are arranged such that the anode side 162 of a first solar cell is connected to the cathode side 164 of a second solar cell or vice versa, wherein the cathode side of the first solar cell is connected to the anode side of the second solar cell.

Figure 2:
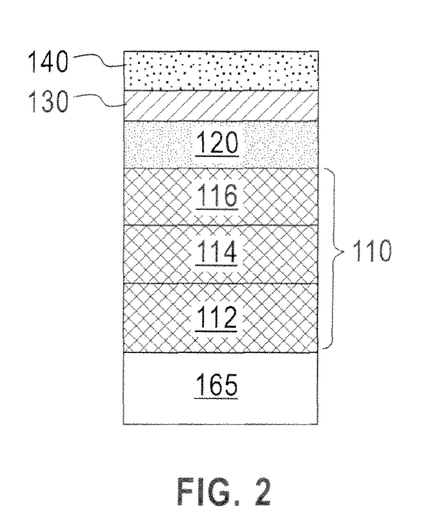
FIG. 2 is a side cross-sectional view of a structure defined by layers on a base substrate in an exemplary method of fabricating the flexible solar cell of FIG. 1.

As shown in FIGS. 2-5, one exemplary method of fabricating an intermediate structure for use in forming the structure 100 is shown. As shown in FIG. 2, the III-V layer 110 is epitaxially grown on a base substrate 165, which may comprise one or more of silicon (Si), silicon carbide (SiC), germanium (Ge), GaAs, GaN, indium phosphide (InP) or other III-V, and the like. In the exemplary embodiment shown, the base substrate 165 comprises Ge.

Still referring to FIG. 2, the III-V layer 110 is deposited on the base substrate 165 as different sub cells. In the III-V layer 110, the various sub cells are grown such that a band gap energy ($E_g$) decreases with each successive sub cell grown. The first sub cell (designated by the reference number 112 and hereinafter referred to as "first sub cell 112") is deposited directly on the base substrate 165. An intermediate sub cell 114 is grown on the first sub cell 112, and a cap sub cell 116 is grown on the intermediate sub cell 114. Together, the first sub cell 112, the intermediate sub cell 114, and the cap cell 116 define the III-V layer 110 as an inverted multi-junction solar cell structure. Although only three sub cells are illustrated, it should be understood by one of ordinary skill in the art that any number of sub cells can be employed to define the III-V layer 110. For example, one sub cell can be deposited to define a single junction inverted structure, two sub cells can be deposited to define an inverted double junction structure, or two or more sub cells can be used to define an inverted multi-junction structure.

Each of the first sub cell 112, the intermediate sub cell 114, and the cap sub cell 116 (as well as other layers (not shown)) may be comprised of binary, tertiary, or quaternary III-V compound semiconductor layers. For example, the absorber layer of the first sub cell 112 may be InGaP (tertiary), the absorber layer of the intermediate sub cell 114 may be GaAs (binary), and the absorber layer of the cap sub cell 116 may be InGaAs (tertiary). In such a configuration, the $E_g$ decreases from the first sub cell 112 to the cap cell 116 (i.e. the $E_g$ of InGaP is 1.9 electron volts (eV) at 300 degrees Kelvin, the $E_g$ of GaAs is 1.412 eV, and the $E_g$ of InGaAs is 0.354-1.41 eV).

The semi-insulating layer 120 is grown on the cap sub cell 116. The semi-insulating layer 120 may comprise an aluminum-rich epitaxial layer such as AlGaAs, indium aluminum gallium phosphide (InAlGaP), or other high band gap material. The AlGaAs or InAlGaP may be p-doped with carbon or zinc, or it may be n-doped with silicon or tellurium. In embodiments in which the semi-insulating layer 120 is aluminum-rich, the semi-insulating layer 120 is oxidized to form aluminum oxide ($Al_2O_3$).

The semi-insulating layer 120 may, as an alternative to comprising an aluminum-rich epitaxial layer, be grown on the cap sub cell 116 as a semi-insulating epitaxial layer such as GaAs or AlGaAs doped with either or both of iron and chromium. Doping of GaAs or AlGaAs with iron and/or chromium imparts a semi-insulating quality to the semi-insulating layer 120.

The semi-insulating layer 120, irrespective of whether such a layer is an aluminum-rich epitaxial layer or a semi-insulating epitaxial layer, is deposited on the cap sub cell 116 at a temperature of about 200 degrees C. to about 800 degrees C. to electrically isolate the stressor layer 150 (and the reflector layer 140, if used) from the cap sub cell 116 of the III-V layer 110.

The dielectric layer 130 is deposited on the semi-insulating layer 120 via a chemical vapor deposition (CVD) technique, atomic layer deposition technique (ALD), or a physical vapor deposition (PVD) technique. The dielectric layer 130 may comprise silicon dioxide ($SiO_2$), $Al_2O_3$, silicon nitrides ($SiN_x$), hafnium oxides, titanium oxides, as well as other metal oxide dielectrics, or the like.

The reflector layer 140 (if used) is deposited on the dielectric layer 130 via CVD, ALD, or PVD. The reflector layer 140 may comprise any suitable metal that is capable of reflecting light received through the III-V layer 110, the semi-insulating layer 120, and the dielectric layer 130 back to the III-V layer 110.

Figure 3:
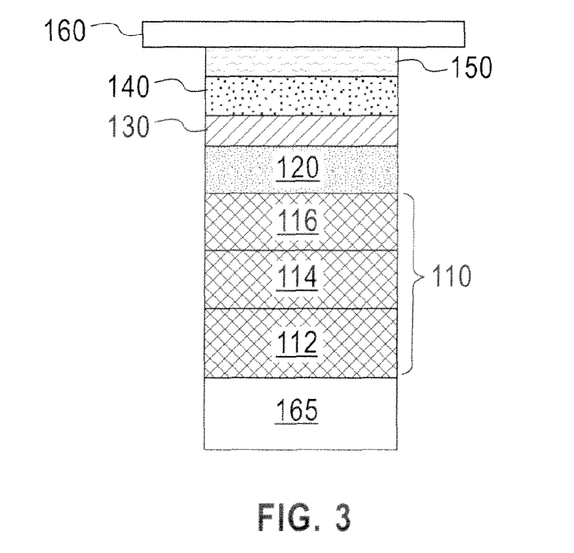
FIG. 3 is a side cross-sectional view of a stressor layer and a flexible handle layer on the layers of FIG. 2.

Referring now to FIG. 3, the stressor layer 150 is deposited on the reflector layer 140 using PVD by sputtering or electroplating. The thickness of the deposited stressor layer 150 is less than the thickness at which spontaneous spalling would occur at room temperature (about 20 degrees C.) but thick enough to permit mechanically-assisted spalling using an external load (controlled spalling). Preferably, the stressor layer 150 is a metal, and more preferably tensile strained nickel deposited to a thickness of about 1 micrometer (um) to about 50 um, or from about 3 um to about 30 um, or about 4 um to about 10 um. The stressor layer 150 is not limited to comprising a single layer of material (e.g., nickel), however, as the stressor layer 150 may comprise multiple layers of different materials.

To facilitate the controlled spalling, the flexible handle substrate 160 is adhered to or otherwise operatively associated with an upper surface of the stressor layer 150. The flexible handle substrate 160 may be adhered to the upper surface of the stressor layer 150 using an adhesive. The flexible handle substrate 160 comprises a foil or a tape that is flexible and has a minimum radius of curvature that is less than about 30 centimeters (cm). If the material of the flexible handle substrate 160 is too rigid, the controlled spalling process may be compromised. One exemplary material for use as the flexible handle substrate 160 comprises a polyimide.

Figure 4:
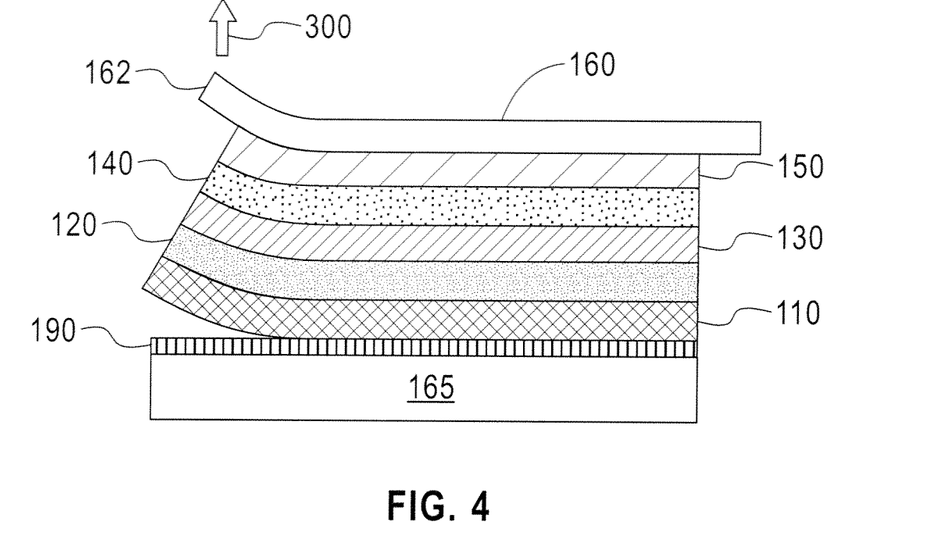
FIG. 4 is a side cross-sectional view of a controlled spalling process on the structure of FIG. 3.

As shown in FIG. 4, the controlled spalling process involves mechanically-assisted removal of the layers between and inclusive of the flexible handle substrate 160 and the III-V layer 110 from the base substrate 165. A fracture plane 190 (for example an engineered cleave plane) may be inserted at an interface of the III-V layer 110 and the base substrate 165. By creating the fracture plane 190, the controlled spalling occurs substantially along the boundary between the III-V layer 110 and the base substrate 165. This results in a well-defined thickness of the III-V layer 110 and smoother fractured surfaces. Examples of fracture planes 190 include buried strained epitaxial layers that are weakened with hydrogen exposure, ion-implanted regions, and deposited layer interfaces.

The controlled spalling process is not limited to the use of a fracture plane 190, in which the fracture depth is engineered to be at or below the interface of the III-V layer 110 and the base substrate 165 by adjusting the intrinsic properties of the stressor layer to satisfy the conditions for spalling mode fracture. The residual layer from the base substrate 165 and/or buffer layers grown prior to the growth of the first sub cell are removed after spalling.

To separate the III-V layer 110 from the base substrate 165 in embodiments incorporating a fracture plane 190, an upward force is applied to an edge portion 162 of the flexible handle substrate 160 in the direction indicated by arrow 300. In doing so, a separation occurs at the fracture plane 190 between the III-V layer 110 and the base substrate 165, thereby allowing the III-V layer 110 to be lifted away from and removed from the base substrate 165. The separation may not occur exclusively at the fracture plane 190, as portions of the base substrate 165 may also be incidentally removed.

Figure 5:
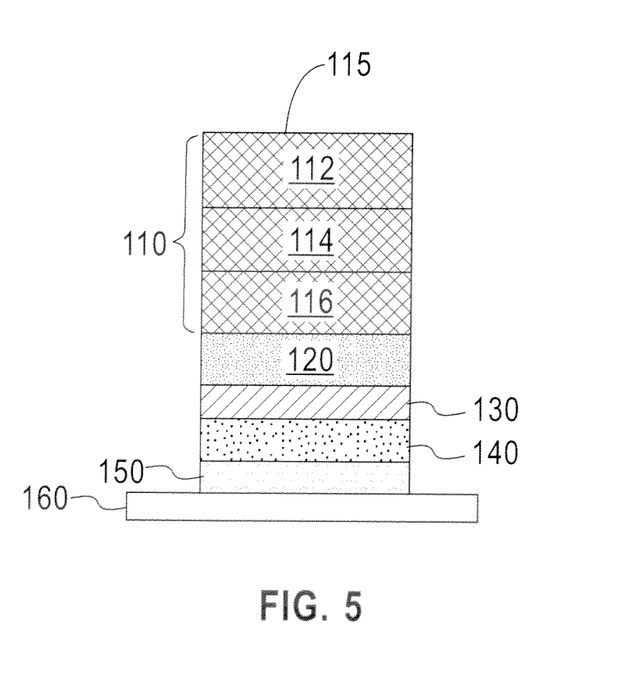
FIG. 5 is a side cross-sectional view of layers removed from the base substrate after the spalling process of FIG. 4.

As shown in FIG. 5, once the controlled spalling process is carried out and the excess layers are removed, a surface 115 of the first sub cell 112 of the III-V layer 110 is exposed. Trenches are formed in the III-V layer 110 to isolate portions of the III-V layer 110 into solar cells. The first insulators 172 and second insulators 174 are disposed in the trenches, and the electrical contacts 170 are disposed between the first insulators 172 and the second insulators 174 (FIG. 1) to monolithically integrate the solar cells to form the structure 100.

Figure 6:
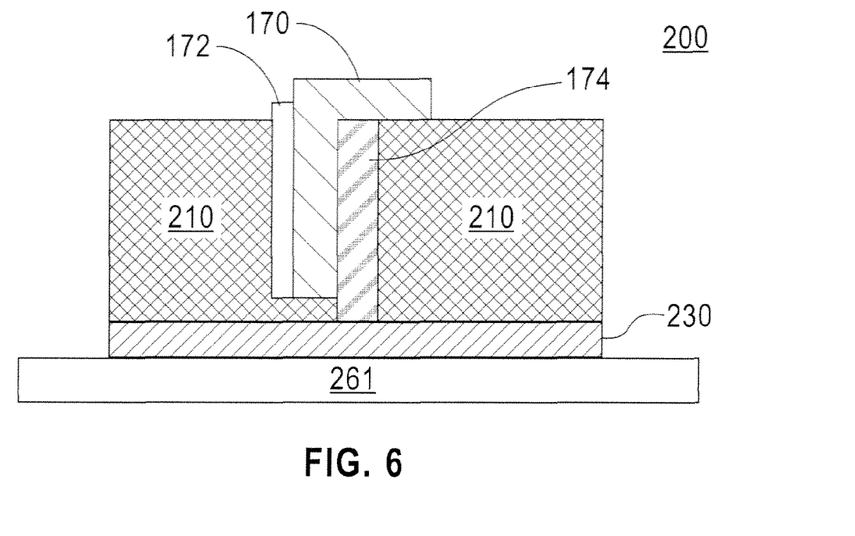
FIG. 6 is a side cross-sectional view of another embodiment of a flexible solar cell, wherein the adjacent cells are connected in series.

As shown in FIG. 6, another exemplary embodiment of the monolithic integration of solar cells into a flexible structure is designated generally by the reference number 200 and is hereinafter referred to as "structure 200." Structure 200 comprises an epitaxially grown III-V layer 210, a dielectric layer 230 on the III-V layer 210, and a second flexible handle substrate 261 adhered to the dielectric layer 230. As in the first embodiment, the dielectric layer 230 may comprise $SiO_2$, $Al_2O_3$, $SiN_x$, or the like. An electrical contact 170 is disposed in the III-V layer 210 for connection of the cells of the structure 200 to other cells.

Figure 7:
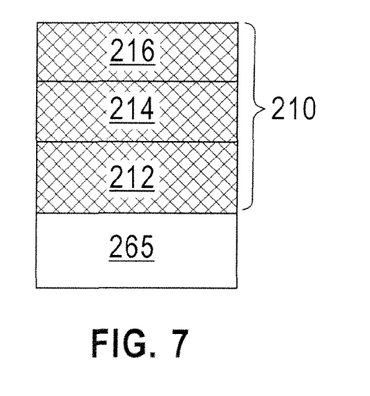
FIG. 7 is a side cross-sectional view of a structure defined by III-V epitaxial layers on a base substrate in an exemplary method of fabricating the flexible solar cell of FIG. 6.

Referring now to FIGS. 7-12, an exemplary method of fabricating an intermediate structure for use in forming the structure 200 is shown. As shown in FIG. 7, the III-V layer 210 is epitaxially grown, as described above, by depositing a first sub cell 212 on a base substrate 265, growing an intermediate sub cell 214 on the first sub cell 212, and growing a cap sub cell 216 on the intermediate sub cell 214. The first sub cell 212, the intermediate sub cell 214, and the cap sub cell 216 collectively define the III-V layer 210 having a triple junction. In the epitaxial growth of the III-V layer 210, the layers are grown such that the band gap energy ($E_g$) increases with each successively grown layer. As with previously-described embodiments, the III-V layer 210 is not limited to three sub cells to define a triple junction structure, as any number of sub cells may be employed (e.g., one sub cell can be employed to define a single junction, two sub cells can be employed to define a double junction, or two or more sub cells can be employed to define a multi-junction).

In one embodiment, the first sub cell of the III-V layer 210 may not be made of III-V layers and is formed in the top portion of the base substrate 265 or grown on the base substrate 265, wherein the first sub cell may be silicon, germanium, GeSb, GeC, SiC, or a combination thereof.

Figure 8:
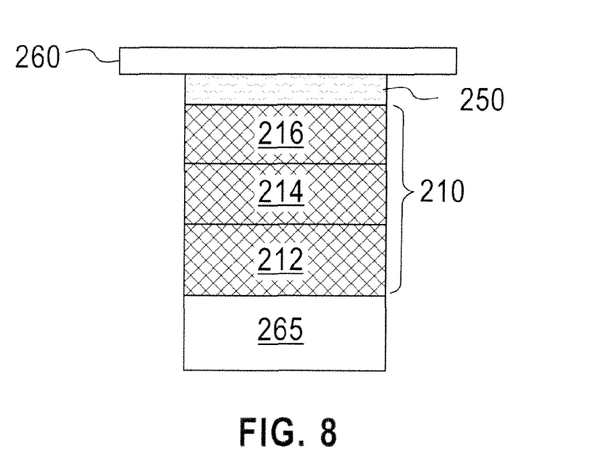
FIG. 8 is a side cross-sectional view of a stressor layer and a flexible substrate layer on the III-V epitaxial layers of FIG. 7.

As shown in FIG. 8, a stressor layer 250 is deposited directly on the cap sub cell 216 using PVD by sputtering or electroplating at about room temperature to a thickness below that which would result in the spontaneous spalling of the base substrate 265. Preferably, the stressor layer 250 is a metal, and more preferably tensile strained nickel deposited to a thickness of about 1 um to about 50 um, or from about 3 um to about 30 um, or about 4 um to about 10 um. The stressor layer 250 is not limited to comprising a single layer of material (e.g., nickel), however, as the stressor layer 250 may comprise multiple layers of different materials.

In a manner similar to that of the previous embodiment, to facilitate the controlled spalling, the flexible handle substrate 260 comprises a foil or a tape (e.g., a polyimide) adhered to an upper surface of the stressor layer 250 using an adhesive.

Figure 9:
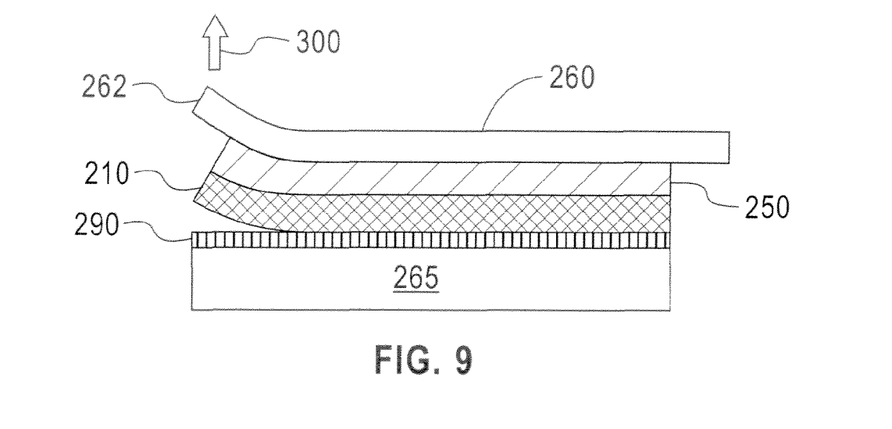
FIG. 9 is a side cross-sectional view of a controlled spalling process on the structure of FIG. 7.

As shown in FIG. 9, a fracture plane 290 is created at below the interface between the first sub cell 212 and the base substrate 265. In the controlled spalling process, an upward force (indicated by arrow 300) is applied to the edge portion 262 of the flexible handle substrate 260, and the flexible handle substrate 260 is used to lift away and mechanically remove the stressor layer 250 and the III-V layer 210 from the base substrate 265.

Figure 10:
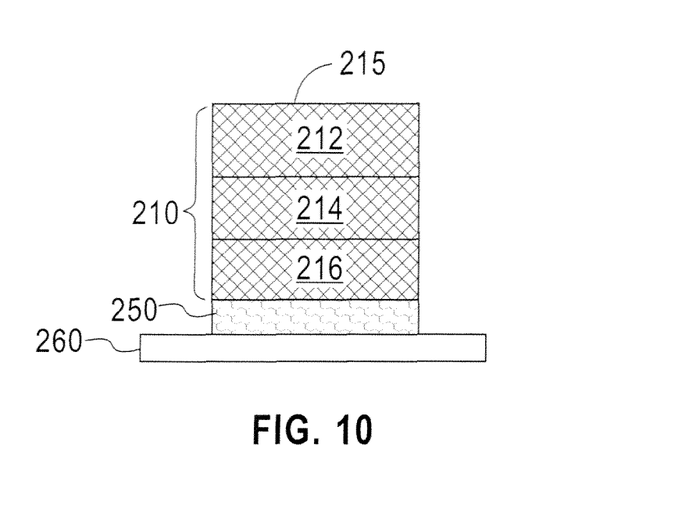
FIG. 10 is a side cross-sectional view of layers removed from the base substrate after the spalling process of FIG. 9.
Figure 11:
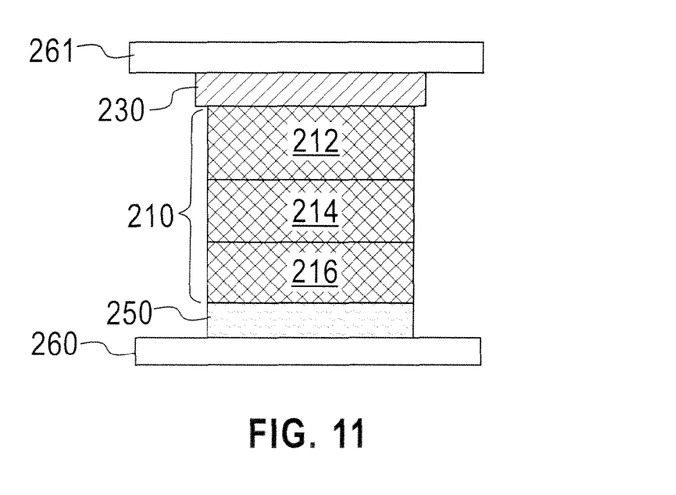
FIG. 11 is a side cross-sectional view of a dielectric layer and a second flexible handle substrate disposed on the layers removed from the base substrate after the spalling process of FIG. 9.

As shown in FIG. 10, once the controlled spalling process is carried out, a surface of the III-V layer 210 (more particularly, a surface 215 of the first layer 212) is exposed. As shown in FIG. 11, the dielectric layer 230 (e.g., $SiO_2$, $Al_2O_3$, $SiN_x$, or the like) is deposited on the first layer 212 via CVD or PVD. A second flexible handle substrate 261 (e.g., polyimide) is adhered to or otherwise coupled to an upper surface of the dielectric layer 230 using an adhesive.

Figure 12:
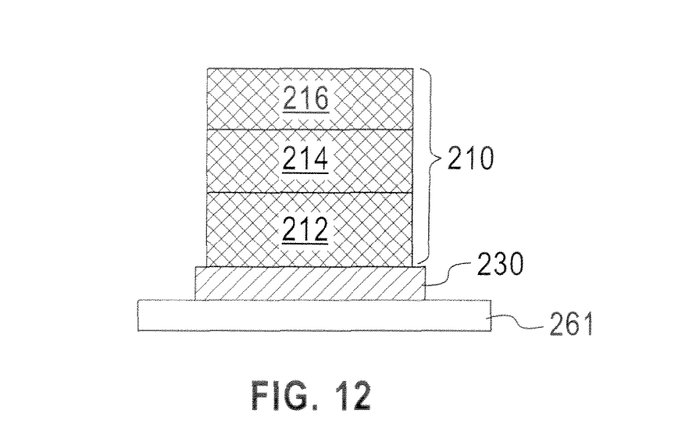
FIG. 12 is a side cross-sectional view of the III-V layer, dielectric layer, and second flexible handle substrate removed from the stressor layer and flexible substrate layer.

As shown in FIG. 12, the flexible handle substrate 260 and the stressor layer 250 are removed from the cap layer 216. The flexible handle substrate 260 is removed from the stressor layer 250 using either a chemical or a physical technique. Chemical techniques include, but are not limited to, the application of a solvent (e.g., acetone) to dissolve the bond between the flexible handle substrate 260 and the stressor layer 250. Physical techniques include, but are not limited to, the use of UV degradation or laser cutting. The use of either technique leaves the stressor layer 250 exposed.

The stressor layer 250 is then removed from the cap layer 216 (the top-most layer of the solar cell) using a dry or wet etch technique that is selective to the cap layer 216. The resulting structure comprises the III-V layer 210 disposed on the dielectric layer 230, to which the second flexible handle substrate 261 is adhered, thereby defining an inverted structure.

Figure 13:
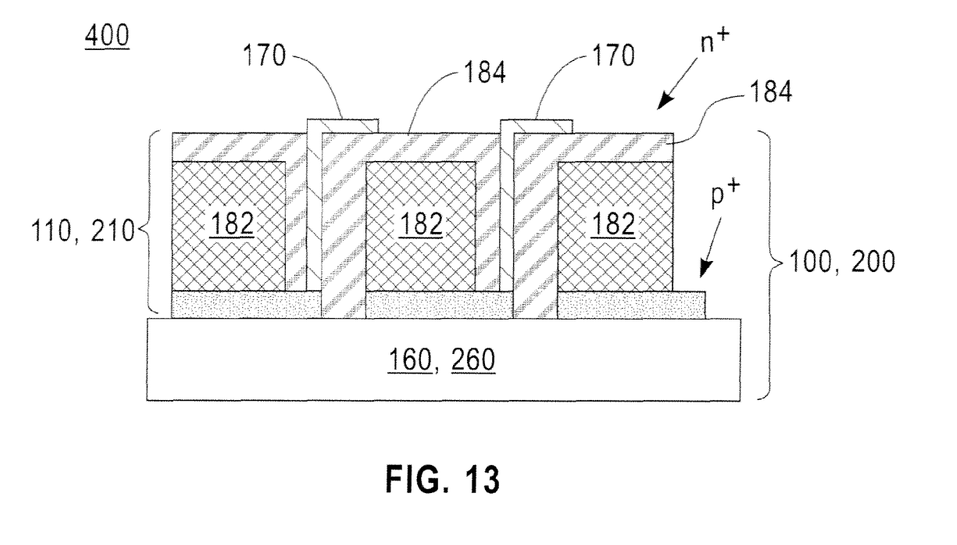
FIG. 13 is a side cross-sectional view of an arrangement of monolithically integrated solar cells, wherein the adjacent solar cells are connected in series.
Figure 14:
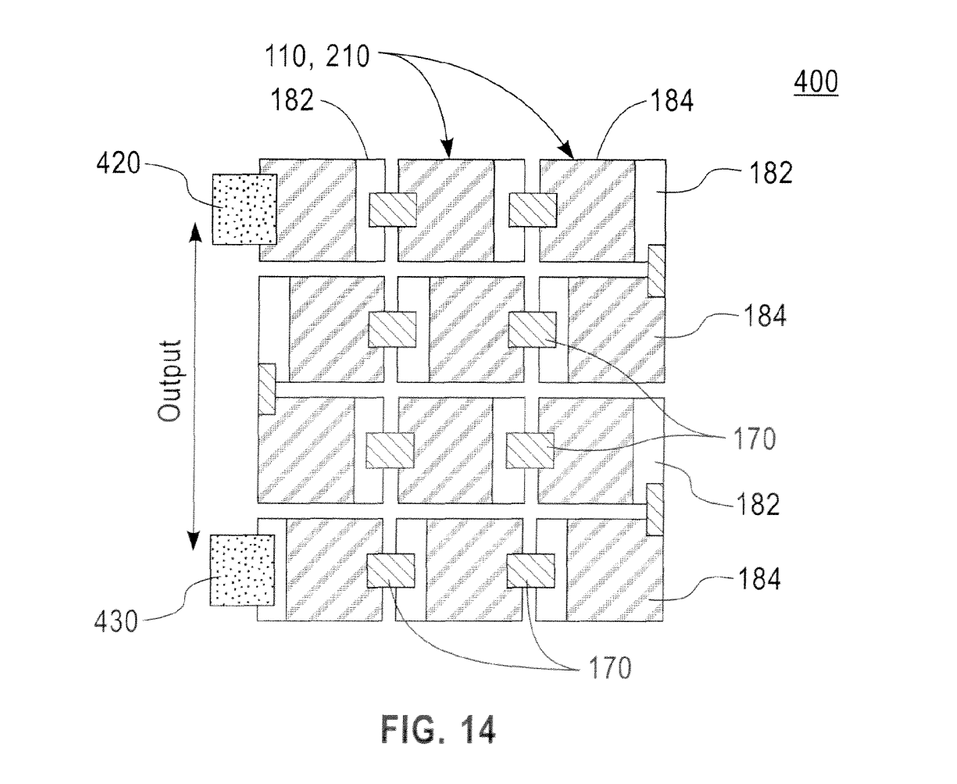
FIG. 14 is a top view of the arrangement of FIG. 13.

As shown in FIGS. 13 and 14, one exemplary embodiment of the monolithic integration of a plurality of either the structure 100 or the structure 200 to form a system is designated generally by the reference number 400 and is hereinafter referred to as "system 400." The system 400 comprises a plurality of monolithically integrated structures arranged in series to define a flexible arrangement of solar cells for any suitable application including, but not limited to, recharging batteries for mobile electronic devices or directly powering mobile electronic devices. In FIG. 13, the semi-insulating layers, dielectric layers, reflector layers, and stressor layers are not shown, and the 111-V layer 110, 210 is shown being disposed directly on the flexible substrate 160, 260.

As can be seen in FIG. 14, the structures 100, 200 each define an individual solar cell, each solar cell being spaced apart and isolated from adjacent solar cells and connected in series via the electrical contacts 170. The electrical contacts 170 facilitate the connection of a bottom portion of each solar cell (shown at 182 in FIGS. 13 and 14) with a top portion of an adjacent solar cell (shown at 184 in FIGS. 13 and 14). This arrangement allows for the operation of the system 400 as a series of diodes through which current flows through the solar cells in one direction. Power may be received from the structures 100, 200 via a first output terminal 420 and a second output terminal 430. Because of the use of the III-V layer, the efficiency of the system 400 (and each structure 100, 200 individually) is greater than 20% under an air mass coefficient of 1.5 (AM1.5) at 1 sun (solar irradiance of 1,000 watts/meter squared).

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical applications, and to enable others of ordinary skill in the art to understand the invention for various embodiments with various modifications as are suited to the particular uses contemplated.

The invention claimed is:

1. A structure, comprising:
   an epitaxially grown layer of semiconductor material comprising a first sub cell, an intermediate sub cell on and in contact with the first sub cell, and a cap sub cell on and in contact with the intermediate sub cell, wherein the epitaxially grown layer of semiconductor material is III-V material;
   an electrical isolation layer disposed on the epitaxially grown layer of semiconductor material;
   a continuous dielectric layer disposed directly on the electrical isolation layer;
   a reflector layer disposed directly on the dielectric layer;
   a stressor layer disposed directly on the reflector layer; and
   a flexible substrate coupled to the stressor layer;
   wherein the stressor layer is disposed between the reflector layer and the flexible substrate
   wherein the electrical isolation layer comprises oxidized aluminum-rich AlGaAs.

2. The structure of claim 1, wherein the epitaxially grown layer of semiconductor material defines an inverted solar cell structure having one or more junctions.

3. The structure of claim 1, wherein the epitaxially grown layer of semiconductor material defines an inverted metamorphic structure having one or more junctions.

4. The structure of claim 1, wherein the electrical isolation layer comprising oxidized aluminum-rich AlGaAs is doped.

5. A structure, comprising:
   an epitaxially grown III-V layer comprising a first sub cell, at least one intermediate sub cell grown on and in contact with the first sub cell, and a cap sub cell grown on and in contact with the at least one intermediate sub cell;
   an electrical isolation layer disposed on the epitaxially grown III-V layer;
   a continuous dielectric layer disposed on the electrical isolation layer;
   a reflector layer disposed directly on the dielectric layer;
   a stressor layer disposed directly on the reflector layer; and
   a flexible substrate coupled to the stressor layer;
   wherein the stressor layer is disposed between the reflector layer and the flexible substrate
   wherein the electrical isolation layer comprises oxidized aluminum-rich AlGaAs.

6. The structure of claim 5, wherein a band gap energy of the epitaxially grown III-V layer decreases from the first sub cell to the cap sub cell.

7. The structure of claim 5, wherein a band gap energy of the epitaxially grown III-V layer increases from the first layer to the cap layer.

8. The structure of claim 5, wherein the dielectric layer is selected from the group consisting of $SiO_2$, $Al_2O_3$, and $SiN_x$.

9. The structure of claim 5, wherein the electrical isolation layer is disposed between the epitaxially grown III-V layer and the dielectric layer.

10. The structure of claim 9, wherein the electrical isolation layer comprises oxidized aluminum-rich AlGaAs doped with either or both of iron and chromium.

11. The structure of claim 5, wherein the oxidized aluminum-rich AlGaAs is unintentionally or intentionally doped with at least one of carbon and zinc or at least one of silicon and tellurium.

12. The structure of claim 5, wherein the electrical isolation layer is oxidized to form $Al_2O_3$.

13. The structure of claim 5, wherein the stressor layer comprises single or multiple metal layers.

14. The structure of claim 13, wherein the stressor layer comprising single or multiple layers has tensile stress.

15. The structure of claim 5, wherein the flexible substrate comprises a polyimide.

16. The structure of claim 5, wherein the epitaxially grown III-V layer defines one of an upright solar cell and an inverted solar cell.

17. The structure of claim 5, wherein the electrical isolation layer comprising oxidized aluminum-rich AlGaAs is doped.

18. A structure, comprising:
- an epitaxially grown layer of semiconductor material comprising a first sub cell, an intermediate sub cell on and in contact with the first sub cell, and a cap sub cell on and in contact, with the intermediate sub cell, wherein the epitaxially grown layer of semiconductor material is III-V material;
- an electrical isolation layer disposed on the epitaxially grown layer of semiconductor material;
- a continuous dielectric layer disposed on the electrical isolation layer;
- a reflector layer disposed directly on the dielectric layer;
- a stressor layer disposed directly on the reflector layer; and
- a flexible substrate coupled to the stressor layer;
- wherein the stressor layer is disposed between the reflector layer and the flexible substrate
- wherein the electrical isolation layer comprises oxidized aluminum-rich InAlGaP.

* * * * *